United States Patent
Ogino

(10) Patent No.: US 9,666,676 B2
(45) Date of Patent: May 30, 2017

(54) METHOD FOR MANUFACTURING A SEMICONDUCTOR DEVICE BY EXPOSING, TO A HYDROGEN PLASMA ATMOSPHERE, A SEMICONDUCTOR SUBSTRATE

(71) Applicant: FUJI ELECTRIC CO., LTD., Kawasaki-shi (JP)

(72) Inventor: Masaaki Ogino, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/882,446

(22) Filed: Oct. 13, 2015

(65) Prior Publication Data
US 2016/0126319 A1    May 5, 2016

(30) Foreign Application Priority Data

Oct. 29, 2014 (JP) .................................. 2014-220810

(51) Int. Cl.
*H01L 21/3213* (2006.01)
*H01L 21/04* (2006.01)
(Continued)

(52) U.S. Cl.
CPC ...... *H01L 29/1608* (2013.01); *H01L 21/0485* (2013.01); *H01L 21/32139* (2013.01); *H01L 29/66068* (2013.01); *H01L 29/45* (2013.01)

(58) Field of Classification Search
None
See application file for complete search history.

(56) References Cited

U.S. PATENT DOCUMENTS

2008/0124922 A1*   5/2008   Kawamura ....... H01L 21/26506
                                                          438/664
2010/0155808 A1    6/2010   Makihara et al.
(Continued)

FOREIGN PATENT DOCUMENTS

JP    2008-135635 A    6/2008
JP    2009-177102 A    8/2009
(Continued)

OTHER PUBLICATIONS

Makihara, K et al., "Fabrication of multiply-stacked structures of Si quantum-dots embedded in $SiO_2$ by combination of low-pressure CVD and remote plasma treatments", 2004 International Microprocesses and Nanotechnology Conference, Oct. 27-29, 2004, pp. 216-217.

(Continued)

*Primary Examiner* — Michael Jung
*Assistant Examiner* — Jay C Chang
(74) *Attorney, Agent, or Firm* — Rabin & Berdo, P.C.

(57) ABSTRACT

A method for manufacturing a semiconductor device having a MOS gate structure includes forming a device structure on a semiconductor substrate; forming an interlayer dielectric to cover the device structure; forming a contact hole through the interlayer dielectric; forming a transition metal film (e.g., Ni) on a portion of the semiconductor substrate exposed by the contact hole; (e) forming a metal film (e.g., Ti) on the entire surface of the semiconductor substrate; forming an oxide film in the surface of the metal film; selectively removing the metal film in which the oxide film has been formed, to thereby expose the transition metal film; and (h) exposing, to a hydrogen plasma atmosphere, the semiconductor substrate in which the transition metal film and the oxide film have been exposed, to thereby cause the transition (Continued)

metal film to generate heat and react with the semiconductor substrate and form an ohmic contact there between.

20 Claims, 9 Drawing Sheets

(51) Int. Cl.
  *H01L 29/66* (2006.01)
  *H01L 29/16* (2006.01)
  *H01L 29/45* (2006.01)

(56) References Cited

U.S. PATENT DOCUMENTS

| 2012/0171863 A1 | 7/2012 | Suzuki et al. |
| 2012/0326167 A1 | 12/2012 | Tamaso |
| 2014/0004690 A1 | 1/2014 | Isogai et al. |

FOREIGN PATENT DOCUMENTS

| JP | 2011-066060 A | 3/2011 |
| JP | 2012-099599 A | 5/2012 |
| JP | 2012-186189 A | 9/2012 |
| JP | 2013-178917 A | 9/2013 |
| WO | WO-2009/118783 A1 | 10/2009 |

OTHER PUBLICATIONS

Kiyokazu Nakagawa, "New Heating Method for Polycrystallization of Amorphous Si Using Microwave Plasma Irradiation", ECS Transactions, vol. 16, No. 10, pp. 905-908, 2008.

Hiroki Nakaie et al., "Formation of Polycrystalline Si Films for Thin-film Transistors by Selective Heating Method of Transition Metal with Hydrogen Radical Irradiation", The 74th JSAP Autumn Meeting, 2013, Doshisha University, Kyoto, Japan, Dec. 16-20, 2013.

H. Nakamura et al., "Development of Heating Method of Transition Metal using Hydrogen Plasma (II)", 2012.

S. Miyazaki et al, "Fabrication of Metal Silicide Nanodots and Hybrid Stacked Structure in Combination with Silicon Quantum Dots for Floating Gate Application", Proceedings of the 3rd Asian Physics Symposium (APS 2009), Bandung, Indonesia, Jul. 22-23, 2009, pp. 13-17.

Katsunori Makihara et al., "Self-Assembling Formation of Ni Nanodots on $SiO_2$ Induced by Remote $H_2$ Plasma Treatment and Their Electrical Charging Characteristics", Japanese Journal of Applied Physics, vol. 47, No. 4, Apr. 25, 2008, pp. 3099-3102.

* cited by examiner

METHOD FOR MANUFACTURING A SEMICONDUCTOR DEVICE BY EXPOSING, TO A HYDROGEN PLASMA ATMOSPHERE, A SEMICONDUCTOR SUBSTRATE

CROSS-REFERENCE TO RELATED APPLICATION(S)

This non-provisional Application for a U.S. Patent claims priority from JP PA 2014-220810 filed Oct. 29, 2014, the entire contents of which are hereby incorporated by reference.

BACKGROUND OF THE INVENTION

1. Field of the Invention

The present invention relates to a method for manufacturing a semiconductor device.

2. Description of the Related Art

According to the background art, it has been well known that an ohmic contact (electric contact portion) between a silicon carbide semiconductor portion and a metal film (electrode) in a semiconductor device (silicon carbide semiconductor device) using a silicon carbide (SiC) semiconductor is formed by thermal treatment (annealing). A method for manufacturing the semiconductor device according to the background art will be described. FIG. 9 is a sectional view schematically showing a state in which the semiconductor device is being manufactured according to the background art. The state of a semiconductor substrate (semiconductor wafer) which is being annealed in a furnace is shown in FIG. 9.

As shown in FIG. 9, a device structure 102 is first formed on a front surface side of a semiconductor substrate made of silicon carbide (hereinafter referred to as "silicon carbide substrate") 101. Then, a nickel (Ni) film 103 is formed on the back surface of the silicon carbide substrate. Next, the nickel film 103 is silicified by a rapid thermal annealing (RTA) furnace 104 for several minutes at a high temperature of about 1,000° C. or higher to form an ohmic contact with the silicon carbide substrate.

As a method for forming the ohmic contact with the silicon carbide substrate in this manner, the following method has been proposed. That is, a transition metal film is formed on a silicon carbide substrate, and the whole of the silicon carbide substrate is then heated by rapid thermal annealing for two minutes at a temperature of 1,000° C. to thereby form a silicide contact electrode having a high carbon content, e.g., see JP-A-2009-177102, paragraph [0017].

In addition, as another method, the following method has been proposed. That is, a nickel film is formed on a silicon substrate and thermal treatment is then performed thereon in a hydrogen ($H_2$) gas atmosphere, e.g., see JP-A-2011-066060, paragraphs [0040] to [0042]. In JP-A-2011-066060, reaction between silicon atoms in the silicon substrate and nickel atoms in the nickel film is accelerated by the thermal treatment in the hydrogen gas atmosphere.

In addition, as a further method, the following method has been proposed. That is, a titanium (Ti) film, an aluminum (Al) film and a silicon film are formed sequentially on a silicon carbide substrate to thereby form a contact electrode, and titanium, aluminum and silicon contained in the contact electrode and silicon and carbon contained in the silicon carbide substrate are then alloyed by laser annealing, e.g., see JP-A-2012-099599, paragraphs [0042] to [0044].

In addition, as a further method, the following method has been proposed. That is, an oxide film ($SiO_2$ film), a quantum dot made of silicon and a nickel thin film are formed sequentially on a silicon substrate, and a laminated film made up of the quantum dot and the nickel thin film is then formed into a nickel silicide dot by remote hydrogen plasma treatment, e.g., see WO 2009/118783, paragraphs [0056] to [0061].

However, according to the background-art manufacturing method, by use of the rapid thermal annealing furnace 104, silicification reaction between silicon atoms in the silicon carbide substrate 101 and nickel atoms in the nickel film 103 can proceed in a boundary between the silicon carbide substrate 101 and the nickel film 103. On this occasion, there is concern that excess carbon (C) atoms in the silicon carbide substrate 101 may be precipitated, clustered and left between the silicon carbide substrate 101 and the nickel film 103. The excess carbon atoms left between the silicon carbide substrate 101 and the nickel silicide film result in an increased contact resistance.

In addition, in the background-art manufacturing method, the whole of the silicon carbide substrate 101 (the whole of the device) is heated uniformly because it is not possible to selectively heat only a portion where the ohmic contact is formed, that is, the nickel film 103 or the boundary between the silicon carbide substrate 101 and the nickel film 103. Therefore, extra heat is applied to the vicinity of the boundary between the silicon carbide substrate 101 and an MOS gate (i.e., an insulating gate made of a metal, an oxide film and a semiconductor) formed as the device structure 102. There is a concern that, for example, device characteristic may deteriorate due to a thermal history caused by the heating.

The invention is directed to solving the foregoing concerns inherent in the background-art techniques. An object of the invention, therefore, is to provide a method for manufacturing a semiconductor device, in which an excellent ohmic contact can be formed and device characteristic can be prevented from deteriorating.

SUMMARY OF THE INVENTION

In order to solve the foregoing concerns and achieve the object of the invention, a method for manufacturing a semiconductor device according to the invention has the following characteristics. First, a first step is performed to form a device structure on the surface of a semiconductor substrate. Then, a second step is performed to form an interlayer dielectric on the surface of the semiconductor substrate so as to cover the device structure. Then, a third step is performed to form a contact hole penetrating the interlayer dielectric in a depth direction. Then, a fourth step is performed to form a transition metal film on a portion of the semiconductor substrate exposed in the contact hole. Then, a fifth step is performed to form a metal film on the whole surface of the semiconductor substrate on the side where the transition metal film has been formed, in order to prevent hydrogen radicals and hydrogen atoms from penetrating downward and invading the device structure. Then, a sixth step is performed to form an oxide film in the surface of the metal film, the oxide film being able to be firmly bound to the metal film and being more chemically stable than the metal film. Then, a seventh step is performed to selectively remove the metal film in which the oxide film has been formed, to thereby expose the transition metal film. Then, an eighth step is performed to expose, to a hydrogen plasma atmosphere, the semiconductor substrate in which the transition metal film and the oxide film have been exposed, to thereby make the transition metal film generate heat so that the transition metal film and the semiconductor substrate can react with each other due to thermal conduction from the transition metal film to thereby form an ohmic contact there between.

In addition, according to the invention, there is provided a method for manufacturing a semiconductor device in the aforementioned configuration, wherein: in the seventh step, the metal film is left in the other portion of the surface of the semiconductor substrate on the side where the transition metal film has been formed, than the portion where the transition metal film has been formed.

In addition, according to the invention, there is provided a method for manufacturing a semiconductor device in the aforementioned configuration, wherein: the fourth step is performed so that a step is first performed to form the transition metal film on the whole surface of the semiconductor substrate on the side where the interlayer dielectric has been formed, a step is then performed to form a resist mask covering a portion of the transition metal film which has been formed inside the contact hole, and a step is then performed to perform etching using the resist mask as a mask to selectively remove the transition metal film to thereby expose the interlayer dielectric; in the fifth step, the metal film is formed on the surface of the interlayer dielectric and the surface of the resist mask; and in the seventh step, the resist mask is removed to thereby selectively remove the metal film.

In addition, according to the invention, there is provided a method for manufacturing a semiconductor device in the aforementioned configuration, wherein: in the eighth step, the oxide film is reduced and the transition metal film is made to generate heat, so that the eighth step can be completed before or at the same time as the reduction of the oxide film is completed.

In addition, according to the invention, there is provided a method for manufacturing a semiconductor device in the aforementioned configuration, wherein: the metal film is a titanium film.

In addition, according to the invention, there is provided a method for manufacturing a semiconductor device in the aforementioned configuration, wherein: the transition metal film is a metal layer made of nickel or tungsten or an alloy layer containing at least one of nickel, titanium, tungsten, molybdenum, tantalum and silver as its main component.

In addition, according to the invention, there is provided a method for manufacturing a semiconductor device in the aforementioned configuration, wherein: in the eighth step, the transition metal film reacts with the semiconductor substrate made of silicon carbide so that the transition metal film can be silicified to thereby form the ohmic contact.

In addition, according to the invention, there is provided a method for manufacturing a semiconductor device in the aforementioned configuration, wherein: the device structure is an insulated gate structure made of a metal, an oxide film and a semiconductor.

According to the aforementioned configurations, after the contact hole has been formed, the transition metal film is formed without inserting a step of forming a metal film (barrier metal) or an oxide film in the surface of the barrier metal in order to prevent hydrogen radicals and hydrogen atoms from penetrating downward. Accordingly, an oxide film in the surface of a silicon carbide semiconductor portion exposed in the contact hole can be removed before the transition metal film is formed. In this manner, the silicon carbide semiconductor portion and the transition metal film can be brought into direct contact with each other. Accordingly, the transition metal film can be silicified by subsequent hydrogen plasma treatment to form an ohmic contact with the silicon carbide semiconductor portion. In addition, the barrier metal or the oxide film in the surface of the barrier metal is formed after the transition metal film has been formed. Accordingly, even when the oxide film on the surface of the silicon carbide semiconductor portion has been removed by cleaning treatment using hydrogen fluoride before the transition metal film is formed, the oxide film in the surface of the barrier metal is not removed. In this manner, even when the barrier metal made of a transition metal has been formed, hydrogen plasma treatment can be performed in the state in which the barrier metal is covered with the oxide film. Accordingly, the barrier metal does not generate heat when the oxide film in the surface of the barrier metal is being reduced. Thus, an extra thermal history is not applied to the portion covered with the barrier metal, i.e. an MOS gate located on the lower side (on the semiconductor substrate side) of the barrier metal. In addition, the barrier metal and the oxide film in the surface of the barrier metal are formed after the transition metal film has been formed. Accordingly, no oxide film is formed in the surface of the transition metal film. Thus, the temperature of only the transition metal film can be increased to a high temperature in a short time.

According to the method for manufacturing a semiconductor device according to the invention, it is possible to obtain an effect in which an excellent ohmic contact low in contact resistance can be formed and device characteristic can be prevented from deteriorating.

DETAILED DESCRIPTION OF THE INVENTION

A preferred embodiment of a method for manufacturing a semiconductor device according to the invention will be described below in detail with reference to the accompanying drawings. In the description and the accompanying drawings, a layer or region prefixed with n or p means that electrons or holes are majority carriers in that layer or region, respectively. In addition, a layer or region designated by n or p suffixed with $^+$ and $^-$ means a higher impurity concentration and a lower impurity concentration than the layer or region designated by n or p suffixed without $^+$ and $^-$. Incidentally, in the following description of the embodiment and the accompanying drawings, like constituents are referred to by like reference signs respectively and correspondingly and duplicate description thereof will be omitted.

Embodiment

Figure 1:
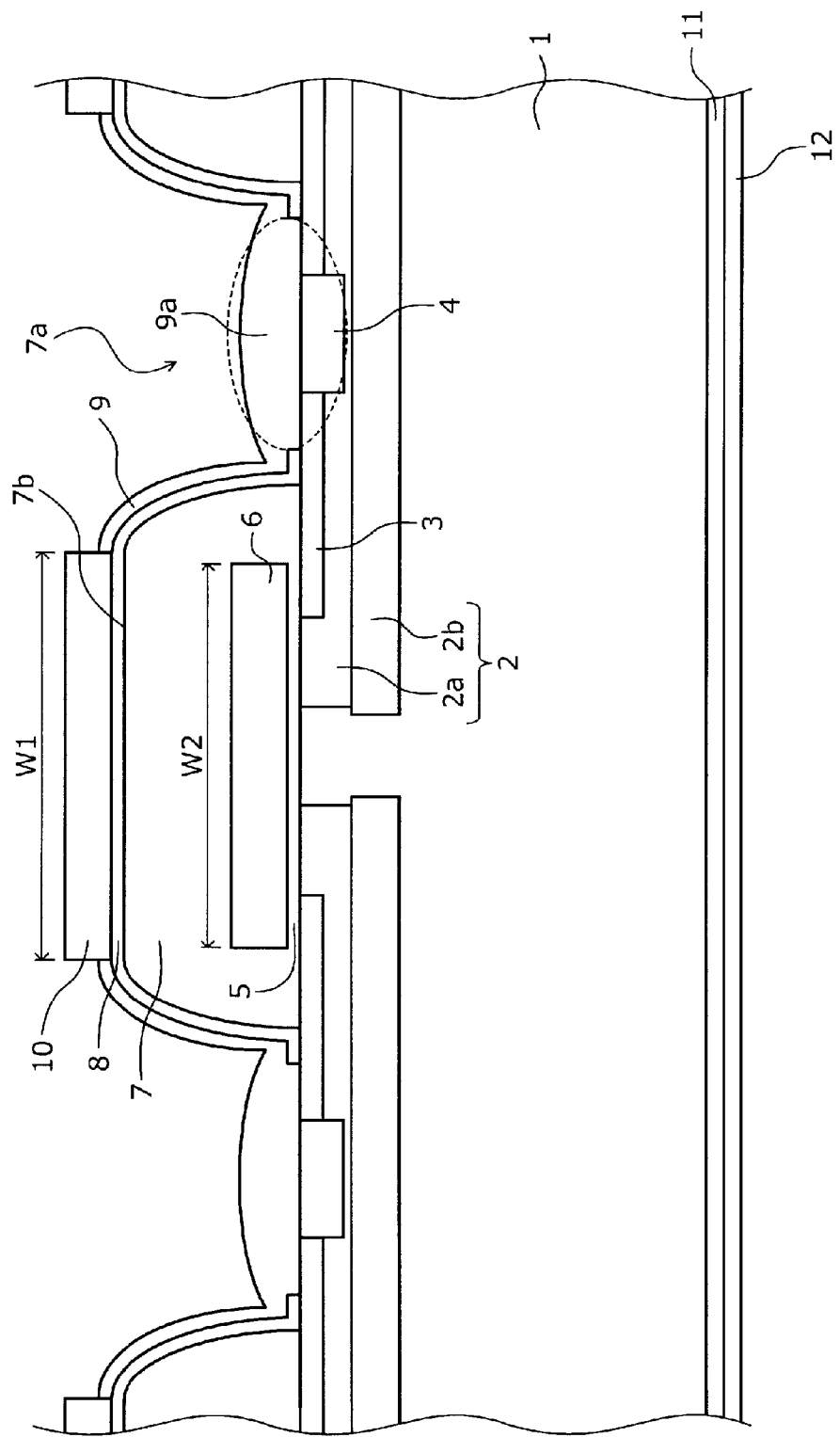
FIG. 1 is a sectional view showing the structure of an example of a semiconductor device manufactured by a method for manufacturing a semiconductor device according to an embodiment of the invention.

An MOSFET (Metal Oxide Semiconductor Field Effect Transistor) will be described as an example of a semiconductor device manufactured by a method for manufacturing a semiconductor device according to an embodiment. FIG. 1 is a sectional view showing the structure of an example of a semiconductor device manufactured by the method for manufacturing a semiconductor device according to the embodiment. As shown in FIG. 1, the semiconductor device according to the embodiment is a vertical type MOSFET with a planar gate structure. The vertical type MOSFET is provided with an MOS gate structure and a front surface electrode (source electrode) on a front surface side of a semiconductor substrate made of silicon carbide (silicon carbide substrate (semiconductor chip)), and provided with a back surface electrode (drain electrode 12) on a back surface side of the silicon carbide substrate.

Specifically, a p-type base region 2 is selectively provided in a surface layer of the front surface of the silicon carbide substrate serving as an n$^-$ type drift layer 1. The p-type base region 2, for example, consists of p-type regions 2a and 2b which are different in impurity concentration and which are disposed to be opposed to each other in a depth direction. An n$^+$ type source region 3 and a p$^+$ type contact region 4 are selectively provided inside the p-type base region 2 (the p-type region 2a exposed in the front surface of the substrate). The n$^+$ type source region 3 is provided on an outer side than the p$^+$ type contact region 4 inside the p-type base region 2. A gate electrode 6 is provided through a gate insulating film 5 on the surface of a portion of the p-type base region 2 which is interposed between the n$^-$ type drift layer 1 and the n$^+$ type source region 3 so that the gate electrode 6 can extend over the surface of the n$^-$ type drift layer 1.

The MOS gate structure is constituted by the p-type base region 2, the n$^+$ type source region 3, the p$^+$ type contact region 4, the gate insulating film 5, and the gate electrode 6. Although one MOS gate structure constituting two unit cells (device's functional units) is shown in FIG. 1, a plurality of unit cells (not shown) may be disposed in parallel so as to be adjacent to these unit cells. An interlayer dielectric 7 is provided on the whole of the front surface of the silicon carbide substrate so as to cover the gate electrode 6. The n$^+$ type source region 3 and the p$^+$ type contact region 4 are exposed in a contact hole 7a which penetrates the interlayer dielectric 7 in the depth direction. For example, a titanium nitride (TiN) film 8 is provided on the surface of the interlayer dielectric 7. It is preferable that the titanium nitride film 8 is disposed so as to cover the whole of the surface of the interlayer dielectric 7 including a side wall of the contact hole 7a.

The titanium nitride film 8 is provided to cover at least a range of from the surface of the interlayer dielectric 7, for example, to a portion covering a boundary between the side wall of the contact hole 7a and the surface of the n$^+$ type source region 3. In consideration of alignment (positioning) accuracy during a manufacturing process, the titanium nitride film 8 may be provided to extend from the surface of the interlayer dielectric 7 to a part of the surface of the n$^+$ type source region 3. It is, however, preferable that the n$^+$ type source region 3 and the p$^+$ type contact region 4 are not entirely covered with the titanium nitride film 8 but are exposed in the contact hole 7a. The reason is as follows. That is, as the exposed area of the n$^+$ type source region 3 and the p$^+$ type contact region 4 in the contact hole 7a increases, a contact area of the n$^+$ type source region 3 and the p$^+$ type contact region 4 with a nickel film 9 which will be described later can increase to thereby decrease contact resistance. Therefore, it is preferable that, of the titanium nitride film 8, a portion extending to the surface of the n$^+$ type source region 3 is as small as possible. In the case where the treatment time of hydrogen plasma treatment is so short that nickel atoms diffused from the nickel film 9 to the interlayer dielectric 7 side during the hydrogen plasma treatment cannot reach the gate insulating film 5, the titanium nitride film 8 does not have to be provided.

The nickel film 9 is provided inside the contact hole 7a so as to make contact with the n$^+$ type source region 3 and the p$^+$ type contact region 4. Of the nickel film 9, a portion (portion encircled by an ellipse indicated by a dotted line) 9a making contact with the n$^+$ type source region 3 and the p$^+$ type contact region 4 is silicified to form an ohmic contact with a silicon carbide semiconductor portion (the n$^+$ type source region 3 and the p$^+$ type contact region 4). The nickel film 9 covers the whole surface of the n$^+$ type source region 3 and the p$^+$ type contact region 4 exposed in the contact hole 7a. Particularly, it is preferable that the contact area between the n$^+$ type source region 3 and the nickel film 9 is increased to thereby decrease contact resistance with the n$^+$ type source region 3. Therefore, the nickel film 9 may extend from the surface of the silicon carbide semiconductor portion to portions of the titanium nitride film 8 on the side wall of the contact hole 7a and on a flat portion 7b of the interlayer dielectric 7 in consideration of the alignment accuracy during the manufacturing process.

The flat portion 7b of the interlayer dielectric 7 is the surface of the interlayer dielectric 7 except the side wall of the contact hole 7a, which surface is flattened substantially in parallel with the front surface of the substrate. A titanium (Ti) film 10 is provided in a portion of the titanium nitride film 8 on the flat portion 7b of the interlayer dielectric 7. The titanium film 10 is provided on the whole surface of the portion of the titanium nitride film 8 where the nickel film 9 is not provided. That is, the whole surface of the titanium nitride film 8 (the whole surface of the interlayer dielectric 7) is completely covered with the nickel film 9 and the titanium film 10. In addition, a titanium oxide (TiO$_2$) film is formed in the surface of the titanium film 10 before the hydrogen plasma treatment is performed. The titanium oxide film has a function of delaying heating of the titanium film 10 and preventing extra heat from being applied to an MOS gate (the gate insulating film 5 and the gate electrode 6) during the hydrogen plasma treatment. Therefore, it is preferable that the titanium film 10 covers the gate electrode 6 entirely with the interposition of the interlayer dielectric 7 and the titanium nitride film 8 there between.

Specifically, for example, it will go well as long as the width W1 of the titanium film 10 in a channel length direction (lateral direction in FIG. 1) is made wider than the width W2 of the gate electrode 6 in the channel length direction. Further, the width of the titanium film 10 in the channel width direction (depth direction in FIG. 1) may be made wider than the width of the gate electrode 6 in the channel width direction. In this case, the surface area of a face of the titanium film 10 opposed to the gate electrode 6 becomes larger than the surface area of a face of the gate electrode 6 opposed to the titanium film 10. Thus, the titanium film 10 can cover the gate electrode 6 entirely and completely with the interposition of the interlayer dielectric 7 and the titanium nitride film 8 there between so that it is possible to obtain a further effect due to the provision of the titanium film 10. The channel length direction means a direction parallel with the flow of a main current flowing into an n-type inversion layer (channel) formed in a portion of the p-type base region 2 (p-type region 2a) along the gate insulating film 5 in the ON time. The channel width direction means a direction parallel with the front surface of the substrate and perpendicular to the channel length direction.

The width W1 of the titanium film 10 may be slightly narrower than the width W2 of the gate electrode 6 according to some design conditions. As long as the gate electrode 6 is substantially entirely covered with the titanium film 10 with the interposition of the interlayer dielectric 7 and the titanium nitride film 8 there between, it is possible to obtain an effect due to the provision of the titanium film 10. For example, the width W1 of the titanium film 10 becomes slightly narrower than the width W2 of the gate electrode 6 when it is intended to miniaturize the semiconductor device. Due to the miniaturization, the width of each unit cell is narrowed to make the width of the flat portion 7b of the interlayer dielectric 7 in the channel length direction narrower than the width W2 of the gate electrode 6 in the channel length direction. Thus, the nickel film 9 is extended up to a position opposed to the gate electrode 6 in the depth direction. Therefore, the width W1 of the titanium film 10 becomes narrower than the width W2 of the gate electrode 6 to thereby reduce the effect obtained due to the provision of the titanium film 10. However, the miniaturization can be attained.

In addition, the titanium film 10 does not extend on the nickel film 9. For example, if the titanium film 10 extends on the nickel film 9 (that is, the nickel film 9 and the titanium film 10 overlap with each other), nickel will be alloyed with titanium in the portion of the nickel film 9 making contact with the titanium film 10 when the nickel film 9 is heated. When the surface is roughened to generate irregularities due to the alloying, the irregularities in the surface will grow further on and after the subsequent formation of a metal electrode (front surface electrode pad), resulting in surface roughness of the metal electrode. The front surface electrode pad (not shown) is provided on the surface of the nickel film 9 and the surface of the titanium film 10 so as to fill the contact hole 7a. A passivation protective film (not shown) is provided on the front surface side of the substrate. An n$^+$ type drain layer 11 is provided on a surface layer of the back surface of the silicon carbide substrate. A drain electrode 12 makes contact with the n$^+$ type drain layer 11.

Figure 2:
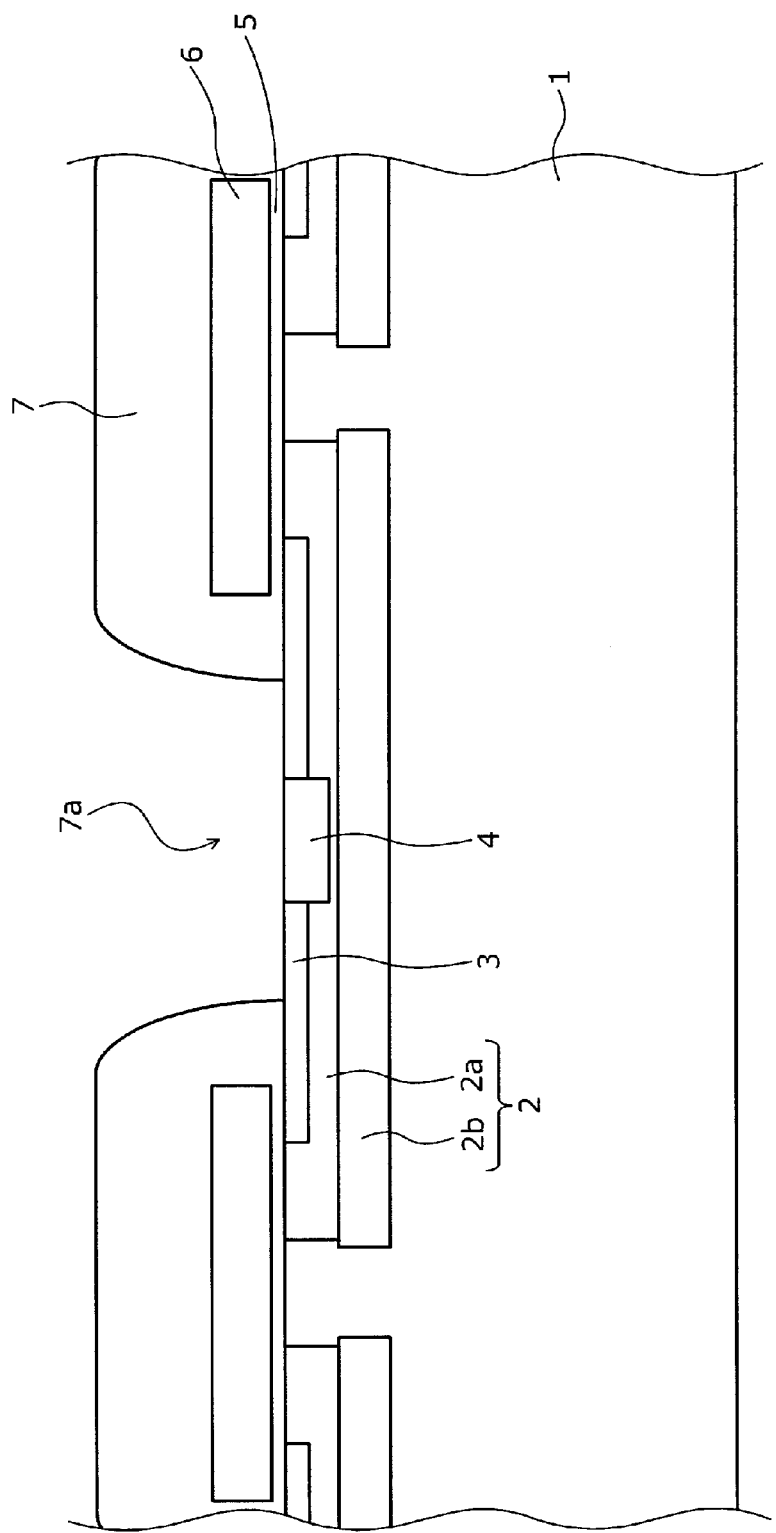
FIG. 2 is a sectional view showing a state in which the semiconductor device is being manufactured according to the embodiment.

Next, the method for manufacturing a semiconductor device according to the embodiment will be described. FIGS. 2 to 8 are sectional views showing states in which the semiconductor device is being manufactured according to the embodiment. First, as shown in FIG. 2, an MOS gate structure including a p-type base region 2, an n$^+$ type source region 3, a p$^+$ type contact region 4, a gate insulating film 5, and a gate electrode 6 is formed on a front surface side of a silicon carbide substrate (silicon carbide wafer) serving as an n$^-$ type drift layer 1 by a typical method. Next, an interlayer dielectric 7 is formed on the whole of the front surface of the silicon carbide substrate to thereby cover the gate electrode 6. Next, a resist mask (not shown) in which a portion corresponding to a region where a contact hole 7a should be formed has been opened is formed by photolithography.

Next, etching using the resist mask as a mask is performed to form the contact hole 7a penetrating the interlayer dielectric 7 in a depth direction to thereby expose the n$^+$ type source region 3 and the p$^+$ type contact region 4. Next, the resist mask which was used for formation of the contact hole 7a is removed by ashing treatment. By this ashing treatment, an oxide film (not shown) is formed on the surface of the n$^+$ type source region 3 and the surface of the p$^+$ type contact region 4 which are exposed in the contact hole 7a. Therefore, treatment for cleaning the silicon carbide substrate using hydrogen fluoride (HF) is performed to remove the oxide film which has been formed on the surface of the n$^+$ type source region 3 and the surface of the p$^+$ type contact region 4. Thus, the n$^+$ type source region 3 and the p$^+$ type contact region 4 are exposed again.

Figure 3:
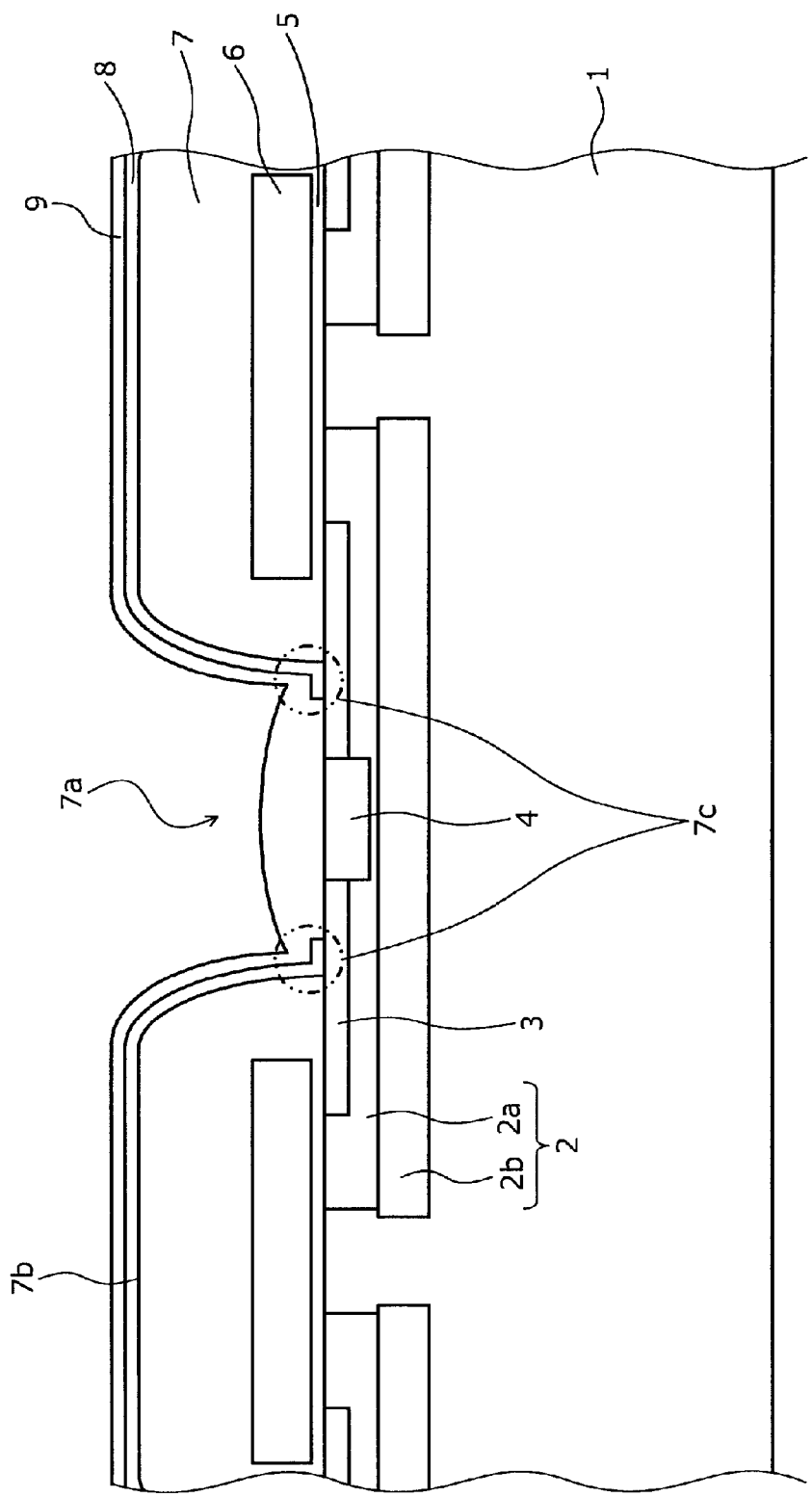
FIG. 3 is a sectional view showing a state in which the semiconductor device is being manufactured according to the embodiment.

Next, as shown in FIG. 3, a titanium nitride film 8 is formed on the surface of the n$^+$ type source region 3, the surface of the p$^+$ type contact region 4 and the surface of the interlayer dielectric 7, for example, by sputtering. Next, a resist mask (not shown) in which the portion corresponding to the contact hole 7a has been opened is formed by photolithography and etching. Next, etching using the resist mask as a mask is performed to remove a portion of the titanium nitride film 8 on the n$^+$ type source region 3 and the p$^+$ type contact region 4. As described above, it is preferable that the whole surface of the interlayer dielectric 7 (a side wall of the contact hole 7a and a flat portion 7b of the interlayer dielectric 7) is covered with the titanium nitride film 8. Therefore, in consideration of alignment accuracy, it is preferable that the resist mask for etching the titanium nitride film 8 is formed not to expose the surface of the interlayer dielectric 7 (particularly, the vicinity of a boundary 7c between the side wall of the contact hole 7a and the surface of the n$^+$ type source region 3).

Next, the resist mask which was used for forming the titanium nitride film 8 is removed by ashing treatment. By this ashing treatment, an oxide film (not shown) is formed on silicon carbide in the surface of the n$^+$ type source region 3 and the surface of the p$^+$ type contact region 4 which are exposed in the contact hole 7a. Therefore, as pre-treatment performed before formation of a nickel film 9, treatment for cleaning the silicon carbide substrate using hydrogen fluoride is performed to remove the oxide film which has been formed on the surface of the n$^+$ type source region 3 and the surface of the p$^+$ type contact region 4. In this manner, the n$^+$ type source region 3 and the p$^+$ type contact region 4 are exposed again. The treatment using hydrogen fluoride after etching of the titanium nitride film 8 may also serve as the aforementioned cleaning treatment performed using hydrogen fluoride after formation of the contact hole 7a, so that the cleaning treatment performed using hydrogen fluoride after formation of the contact hole 7a can be omitted. Incidentally, in the case where the aforementioned titanium nitride film 8 is not formed, the cleaning treatment using hydrogen fluoride may be performed after formation of the contact hole 7a, as pre-treatment performed before formation of the nickel film 9.

Next, the nickel film 9 is formed on the surface of the n$^+$ type source region 3, the surface of the p$^+$ type contact region 4 and the surface of the titanium nitride film 8, for example, by sputtering. For example, the thickness of the nickel film 9 is substantially set in the range not smaller than 10 nm and not larger than 200 nm. It is desired that the nickel film 9 is thick enough to secure at least a heating amount with which a boundary between the nickel film 9 and the silicon carbide substrate can be heated satisfactorily, while the nickel film 9 is so close (thin) to the boundary with the silicon carbide substrate that thermal conduction loss or energy shortage required for forming an ohmic contact can be prevented and heat of the nickel film 9 can be prevented from being conducted to the periphery due to thermal diffusion.

Figure 4:
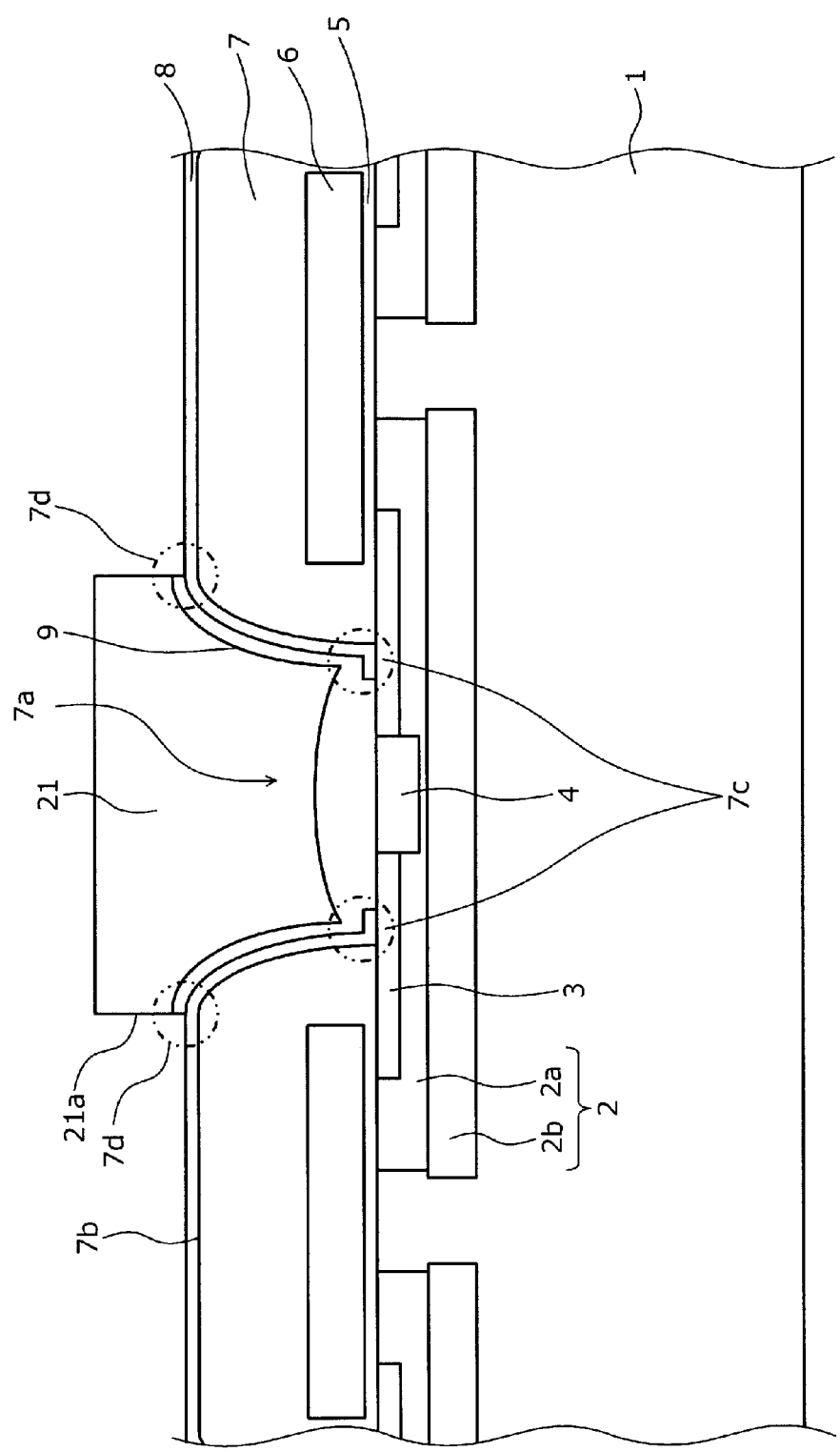
FIG. 4 is a sectional view showing a state in which the semiconductor device is being manufactured according to the embodiment.

Next, as shown in FIG. 4, a resist mask 21 in which a portion corresponding to a region where a titanium film 10 should be formed has been opened is formed on the surface of the nickel film 9 by photolithography. That is, the resist mask 21 is formed to fill the contact hole 7a. On this occasion, in consideration of alignment accuracy, it is preferable that the resist mask 21 is formed not to expose the surface of the $n^+$ type source region 3 and the surface of the $p^+$ type contact region 4 (particularly the vicinity of the boundary 7c between the side wall of the contact hole 7a and the surface of the $n^+$ type source region 3). The reason is as follows. That is, after etching using the resist mask 21 as a mask is then performed on the nickel film 9, the nickel film 9 can be left surely on the whole surface of the $n^+$ type source region 3 and the whole surface of the $p^+$ type contact region 4 to thereby reduce contact resistance. For example, the resist mask 21 may be extended onto the interlayer dielectric 7 so as to cover at least a boundary 7d between the side wall of the contact hole 7a and the flat portion 7b of the interlayer dielectric 7.

Figure 5:
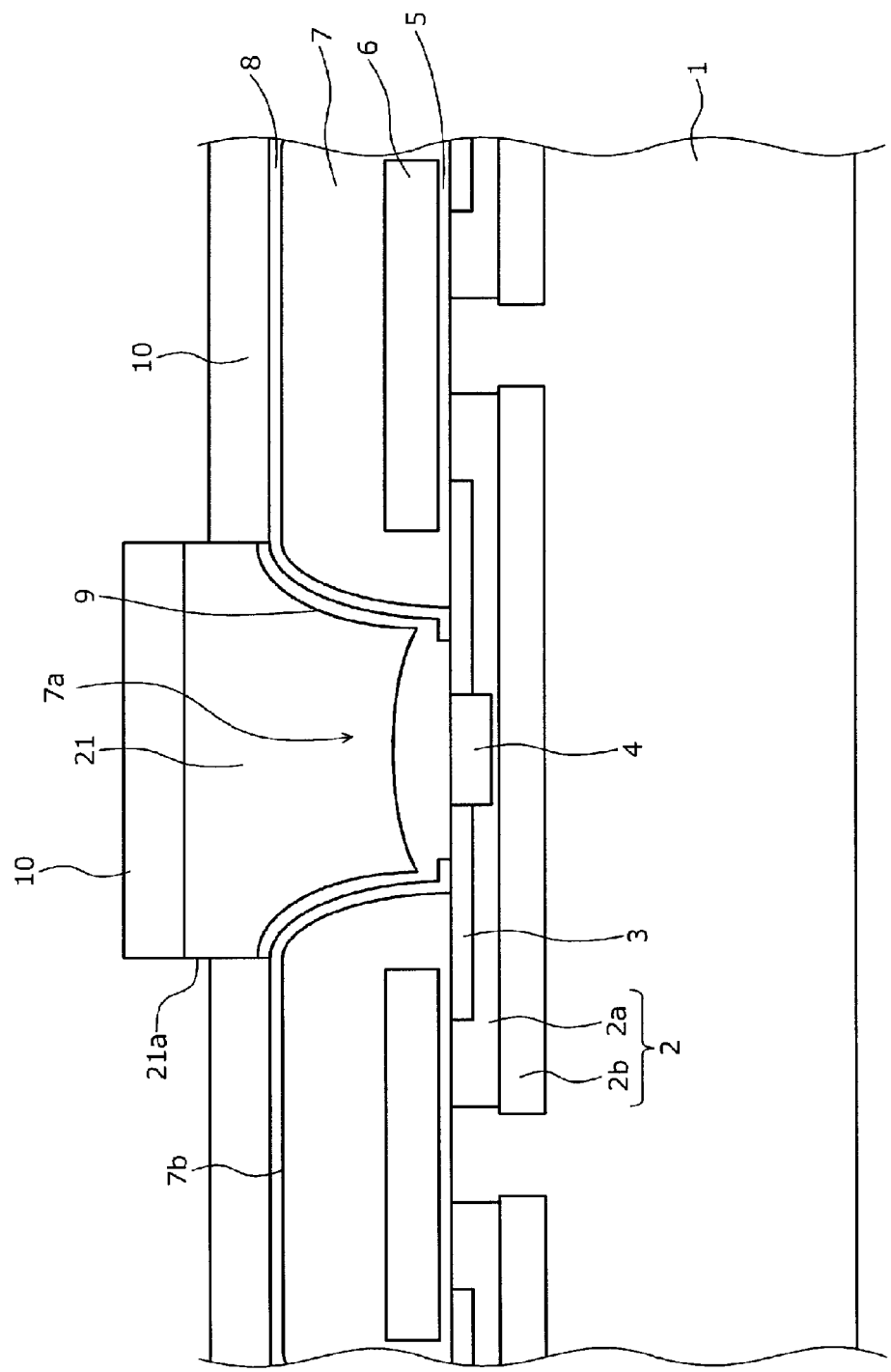
FIG. 5 is a sectional view showing a state in which the semiconductor device is being manufactured according to the embodiment.

Next, etching using the resist mask 21 as a mask is performed to selectively remove the nickel film 9. Thus, the titanium nitride film 8 is exposed in an opening portion 21a of the resist mask 21, and the nickel film 9 stays behind so as to cover the whole surface of the $n^+$ type source region 3 and the whole surface of the $p^+$ type contact region 4. Next, as shown in FIG. 5, while the resist mask 21 is left as it is, for example, sputtering is performed to form the titanium film 10 on the surface of the resist mask 21 and the surface of the titanium nitride film 8. The thickness of the titanium film 10 may be equal to the thickness of the nickel film 9. For example, the thickness of the titanium film 10 is substantially set in the range not smaller than 40 nm and not larger than 150 nm.

Figure 6:
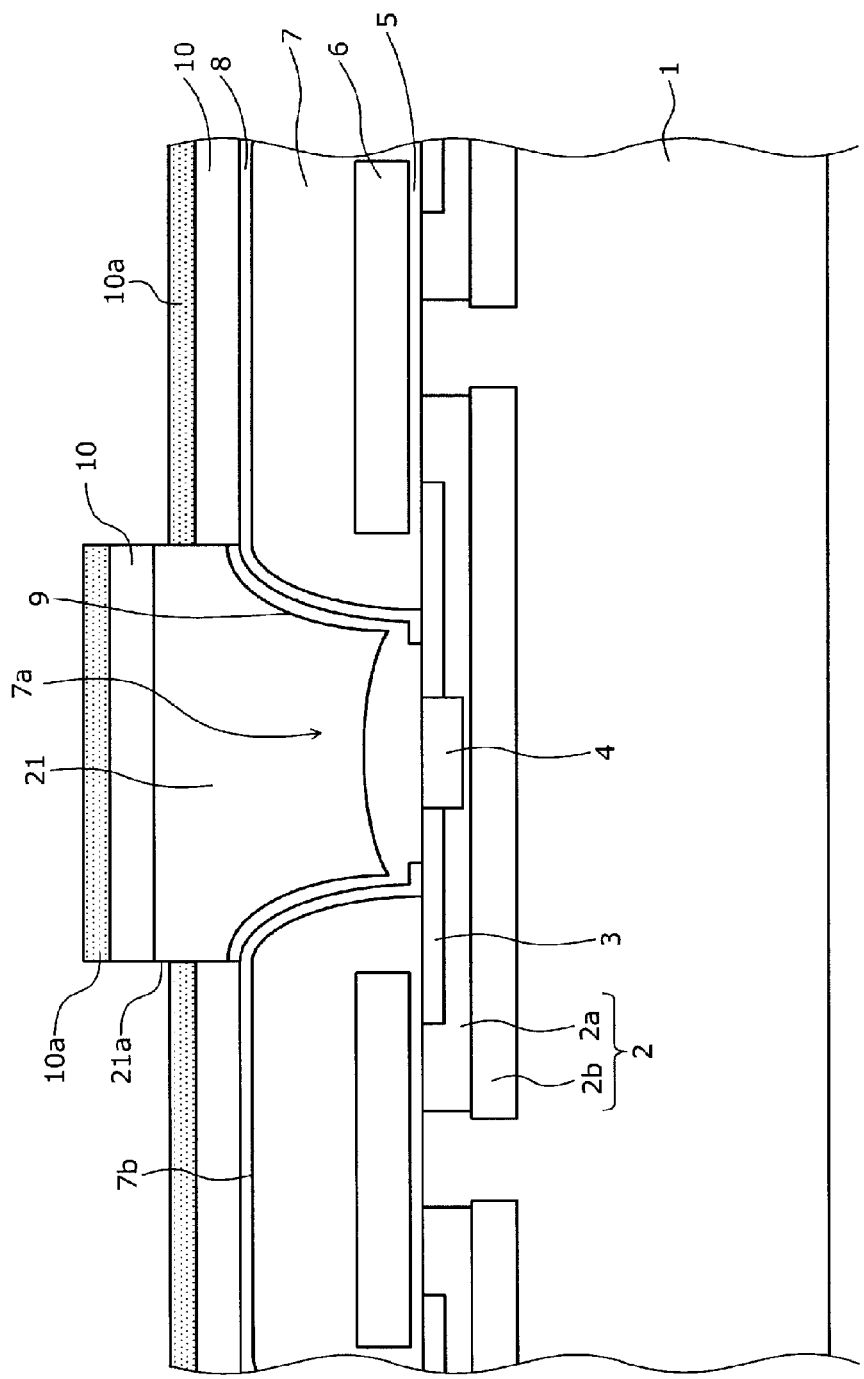
FIG. 6 is a sectional view showing a state in which the semiconductor device is being manufactured according to the embodiment.

Next, as shown in FIG. 6, the whole of the silicon carbide substrate (the whole device including constituents formed on the silicon carbide substrate) is exposed, for example, to an oxygen ($O_2$) plasma atmosphere (hereinafter referred to as oxygen plasma treatment). By the oxygen plasma treatment, a surface layer of the titanium film 10 is oxidized to thereby form a titanium oxide film 10a which is firmly bound to the titanium film 10 and chemically stable (hardly reacts chemically). The oxygen plasma treatment is performed on conditions such that the titanium film 10 can stay behind with a predetermined thickness. For example, the thickness of the titanium oxide film 10a is substantially set in the range not smaller than 20 nm and not larger than 100 nm. During formation of the titanium oxide film 10a, the resist mask 21 and the titanium film 10 laminated on the nickel film 9 prevent the nickel film 9 from being exposed. Therefore, the nickel film 9 is not oxidized. The titanium oxide film 10a may be formed by typical oxidation treatment such as natural oxidation in place of the oxygen plasma treatment.

Figure 7:
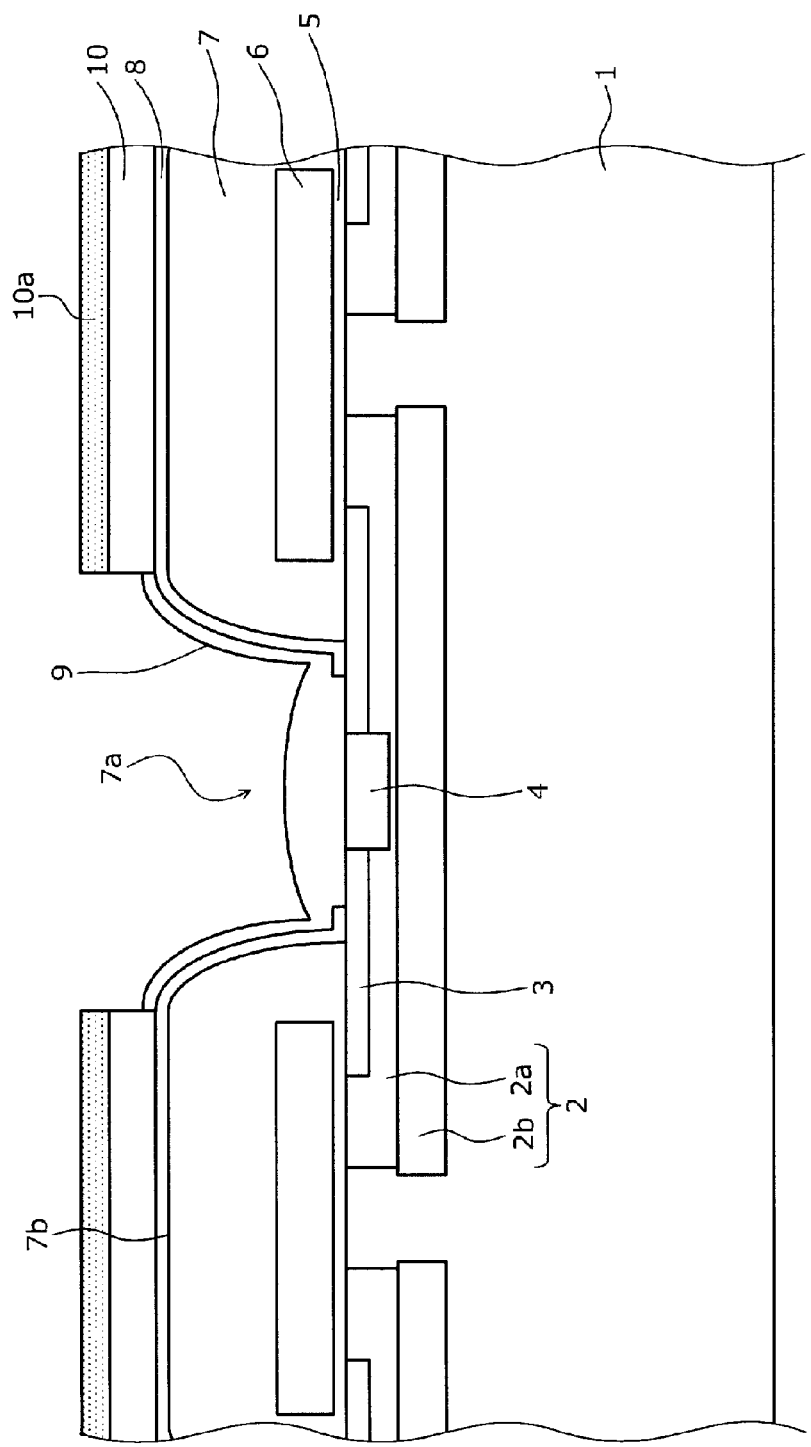
FIG. 7 is a sectional view showing a state in which the semiconductor device is being manufactured according to the embodiment.

Next, as shown in FIG. 7, the resist mask 21 which was used for selectively removing the nickel film 9 is removed using a resist release agent. A portion of the titanium film 10 and the titanium oxide film 10a on the resist mask 21 is removed (lifted off) together with the resist mask 21. Thus, the nickel film 9 staying behind inside the contact hole 7a is exposed, and the titanium film 10 and the titanium oxide film 10a stay behind all over a portion of the titanium nitride film 8 from which the nickel film 9 has been removed. That is, the nickel film 9 and the titanium oxide film 10a are exposed on the front surface side of the silicon carbide substrate. The titanium film 10 is covered with the titanium oxide film 10a to be prevented from being exposed.

Next, the whole of the silicon carbide substrate (the whole device including the constituents formed on the silicon carbide substrate) is exposed to a hydrogen plasma atmosphere (hydrogen plasma treatment). Thus, the nickel film 9 and the titanium oxide film 10a are exposed to the hydrogen plasma atmosphere. In the hydrogen plasma treatment, upon reception of binding energy released when hydrogen radicals (hydrogen atoms or hydrogen radicals) in the hydrogen plasma atmosphere are adsorbed to be formed into hydrogen molecules, the vicinity of the surface of the nickel film 9 generates heat to be heated. On the other hand, the titanium oxide film 10a is exposed to the hydrogen plasma atmosphere to be gradually reduced, with the result that thickness of the titanium oxide film 10a is reduced. Since the titanium film 10 is covered with the titanium oxide film 10a, the titanium film 10 is not exposed to the hydrogen plasma atmosphere unless the reduction of the titanium oxide film 10a is completed.

Figure 8:
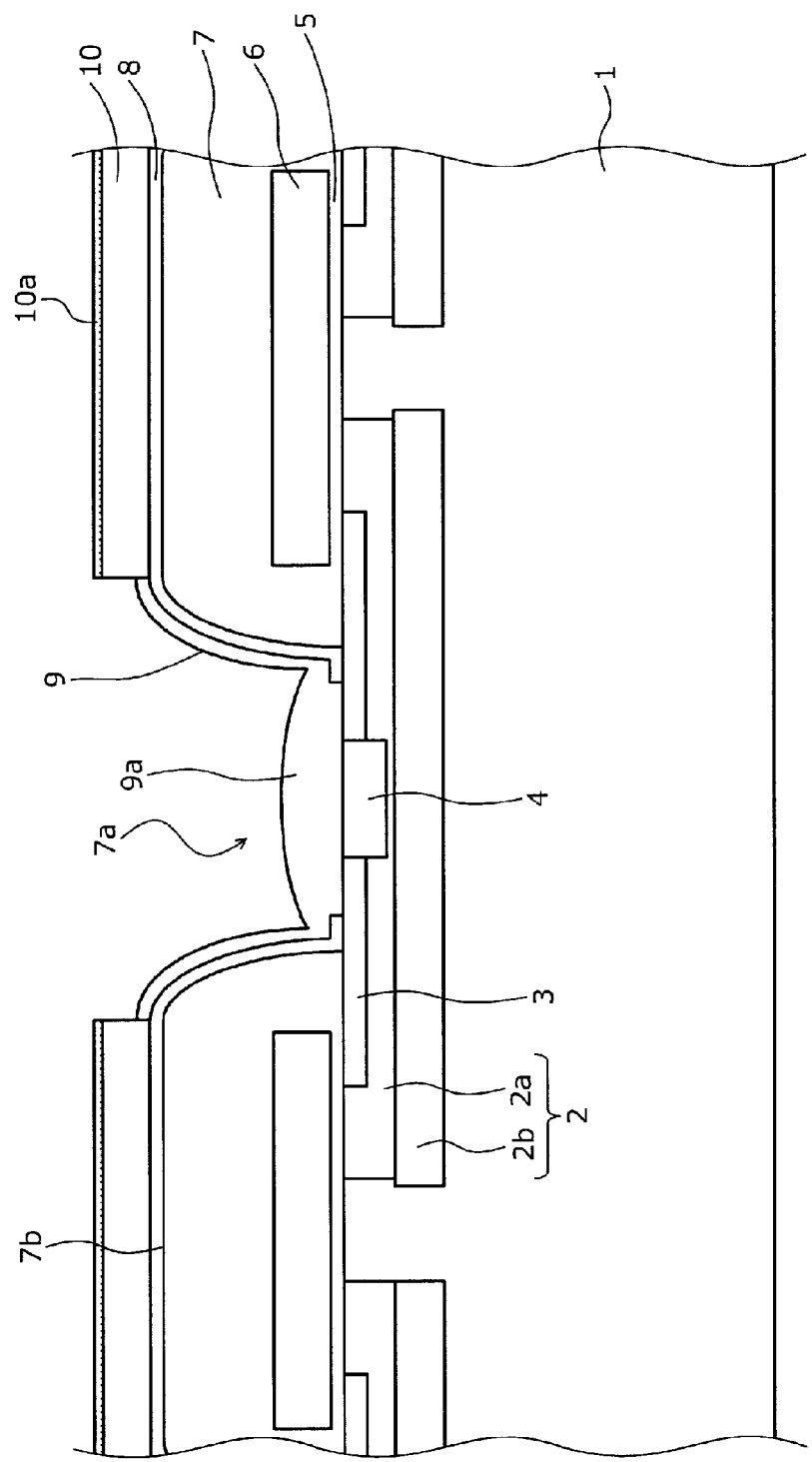
FIG. 8 is a sectional view showing a state in which the semiconductor device is being manufactured according to the embodiment.
Figure 9:
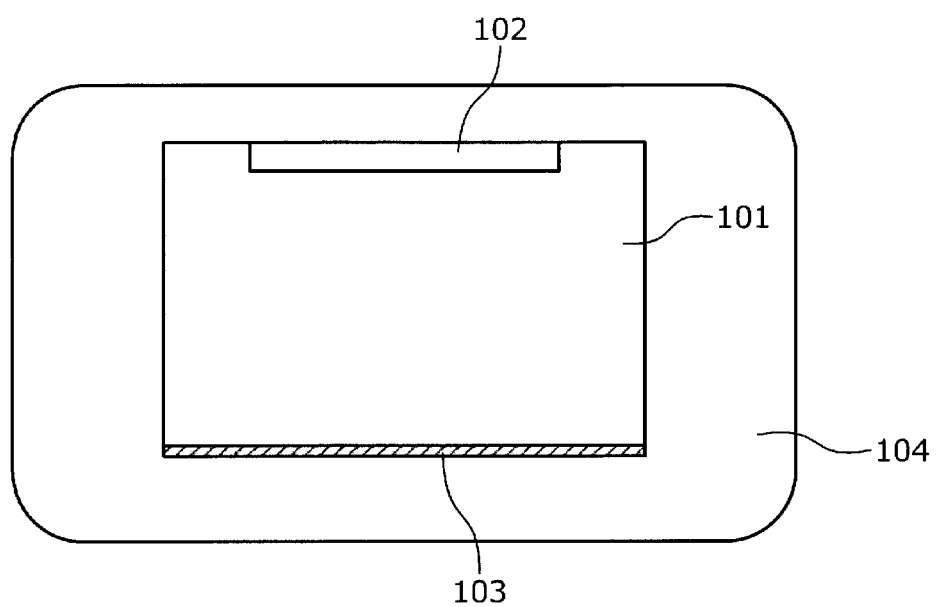
FIG. 9 is a sectional view schematically showing a state in which a semiconductor device is being manufactured according to the background art.

The thermal history caused by the heat generated by the nickel film 9 due to the hydrogen plasma treatment is conducted toward the silicon carbide substrate. Thus, as shown in FIG. 8, the silicon carbide semiconductor portion (the $n^+$ type source region 3 and the $p^+$ type contact region 4) is heated, and of the nickel film 9, a portion 9a making contact with the silicon carbide semiconductor portion is silicified. As a result, an ohmic contact is formed between the nickel film 9 and the silicon carbide semiconductor portion. On the other hand, of the nickel film 9, the other portion than the portion 9a making contact with the silicon carbide semiconductor portion is not silicified but can be kept in the state prior to the hydrogen plasma treatment. In addition, hydrogen radicals are applied (radiated) to the whole of the silicon carbide substrate (the whole surface of the device), but heat is generated due to energy received from the hydrogen radicals only in the transition metal, i.e. the nickel film 9 exposed to a hydrogen radical atmosphere. Although the titanium film 10 is also a transition metal, the titanium film 10 is covered with the titanium oxide film 10a to be prevented from being exposed to the hydrogen radical atmosphere. Therefore, unless the titanium film 10 is exposed because the reduction of the titanium oxide film 10a is completed, the titanium film 10 does not generate heat. Therefore, unless the reduction of the titanium oxide film 10a is completed, only the nickel film 9 generates heat to be heated. That is, by use of a time difference between a time instant when heating of the nickel film 9 starts and a time instant when the reduction of the titanium oxide film 10a is completed (the titanium film 10 is exposed), only the nickel film 9 can be heated, and, of the nickel film 9, the portion 9a making contact with the silicon carbide semiconductor portion can be silicified. Accordingly, the dimensions of the respective portions and the conditions for the hydrogen plasma treatment are set so as to complete the plasma treatment before or at the same time as the reduction of the titanium oxide film 10a is completed. Thus, the ohmic contact between the nickel film 9 and the silicon carbide semiconductor portion can be formed without giving extra heat to the MOS gate.

The temperature rise caused by the heat generated by the nickel film 9 due to the binding energy which is released when the hydrogen radicals are adsorbed to be formed into hydrogen molecules is, for example, at least about 900° C., which is a temperature where an ohmic contact can be formed between the nickel film 9 and the silicon carbide semiconductor portion, or preferably at least about 1,000° C. The temperature rise caused by the heat generated by the nickel film 9 before the titanium film 10 starts to generate heat may be adjusted, for example, by suitable setting as to the thickness of the nickel film 9, the thickness of the titanium oxide film 10a, the plasma density of the hydrogen plasma and electric power. As described above, as the temperature of the nickel film 9 rises to a high temperature in a shorter time, the contact resistance can be made lower. Therefore, the thickness of the nickel film 9, the plasma density of the hydrogen plasma and the electric power are set so that the temperature rise caused by the heat generated by the nickel film 9 can reach a high temperature in a time (e.g. several tens of seconds) as short as possible. It is preferable that the thickness of the titanium oxide film 10a is set so that the titanium film 10 can be prevented from being exposed unless the temperature rise caused by the heat generated by the nickel film 9 reaches a predetermined temperature.

The hydrogen plasma used in the hydrogen plasma treatment is, for example, microwave plasma generated by collisional ionization for which electrons accelerated by an electric field generated by microwaves collide with gas molecules of almost 100% pure hydrogen ($H_2$) gas introduced into a chamber and decreased in pressure to a predetermined pressure. It is preferable that microwaves whose frequency band is industrially applicable and whose frequency is at least 1 GHz where highly dense hydrogen plasma can be generated or more preferably 2.45 GHz are used as the microwaves. In addition, it is preferable that the pressure of the hydrogen gas is reduced, for example, to be not lower than about 10 Pa and not higher than about 100 Pa, in order to generate highly dense hydrogen plasma. Here, the hydrogen plasma atmosphere formed by the microwaves is simply expressed as hydrogen plasma atmosphere.

The aforementioned plasma conditions are as follows. For example, microwave power for generating the hydrogen plasma atmosphere is not lower than about 700 W, preferably not lower than about 1,000 W. In addition, it is preferable that the time in which the silicon carbide substrate is entirely exposed to the hydrogen plasma atmosphere (hydrogen plasma treatment time) is as short as possible. The reason is as follows. That is, if the hydrogen plasma treatment time is long, the heat generated by the nickel film 9 during the hydrogen plasma treatment will be thermally conducted to the whole of the silicon carbide substrate to thereby heat the whole of the silicon carbide substrate. The temperature rise caused by the heat generated by the nickel film 9 becomes high depending on the height of the plasma density of the hydrogen plasma and the magnitude of the electric power. Therefore, the plasma density of the hydrogen plasma and the electric power may be set so that the nickel film 9 can receive energy of hydrogen radicals and generate heat to a predetermined temperature within a short time in which the nickel film 9 is exposed to the hydrogen plasma atmosphere.

In addition, since the surface of the titanium nitride film 8 (the surface of the interlayer dielectric 7) is entirely and completely covered with the nickel film 9 and the titanium film 10 during the hydrogen plasma treatment, the following effect can be obtained. The nickel film 9 generates heat upon reception of energy from the hydrogen radicals as described above. Therefore, when the temperature of the nickel film 9 is rising due to the heat generated from itself, the hydrogen radicals applied (radiated) to the nickel film 9 do not penetrate the nickel film 9. That is, the nickel film 9 serves as a barrier metal which blocks the hydrogen radicals during the hydrogen plasma treatment. The titanium film 10 serves as a barrier metal which occludes the hydrogen radicals and blocks the hydrogen radicals during the hydrogen plasma treatment. Accordingly, the hydrogen radicals can be prevented from invading the MOS gate.

In addition, even when a metal film made of another transition metal than nickel is formed as the front surface electrode and in place of the aforementioned nickel film 9, the same effect as that of the nickel film 9 can be obtained. A transition metal is any metal element from among Group III elements to Group XI elements in the periodic table of the elements. Preferably, the transition metal forming the front surface electrode is a metal such as nickel (Ni), titanium (Ti), tungsten (W), molybdenum (Mo), tantalum (Ta), or silver (Ag), or an alloy containing at least one of these metals as its main component. More preferably, the transition metal forming the front surface electrode is a metal such as nickel, titanium, tantalum or tungsten, or an alloy containing at least one of these metals as its main component. The reason is as follows. That is, in comparison with other transition metals, nickel, titanium, tantalum and tungsten are lower in material cost, and more easily form an ohmic contact with the semiconductor portion. Accordingly, nickel, titanium, tantalum and tungsten have higher practicality.

Next, for example, a metal film made of aluminum (Al) and silicon (Si) is formed as a front surface electrode pad on the front surface side of the substrate, for example, by sputtering, so as to fill the contact hole 7a. Then, a passivation protective film or the remaining constitution portion on the front surface side is formed by a typical method. Then, an $n^+$ type drain layer 11 is formed on the back surface of the silicon carbide substrate by a typical method. Then, a drain electrode 12 forming an ohmic contact with the $n^+$ type drain layer 11 is formed as a back surface electrode, for example, by the same method as that for forming the front surface electrode. Then, a back surface electrode pad making contact with the drain electrode 12 is formed. Then, the silicon carbide substrate is cut (diced) into chips. Thus, an MOSFET shown in FIG. 1 is completed.

As described above, according to the embodiment, after the contact hole is formed, the nickel film is formed without inserting a step of forming a titanium film or a titanium oxide film. Accordingly, an oxide film generated on the surface of the silicon carbide semiconductor portion, for example, due to natural oxidation or due to the formation of the titanium nitride film, etc. can be removed before the nickel film is formed. Thus, the silicon carbide semiconductor portion and the nickel film can be brought into direct contact with each other. Accordingly, the nickel film can be silicified in subsequent hydrogen plasma treatment for forming an ohmic contact. In addition, the titanium film and the titanium oxide film are formed after the nickel film is formed. Thus, even when an oxide film on the surface of the silicon carbide semiconductor portion is removed by cleaning treatment using hydrogen fluoride before the nickel film is formed, the titanium oxide film on the surface of the titanium film is not removed. In this manner, hydrogen plasma treatment for forming an ohmic contact can be performed in the state in which the titanium film is covered with the titanium oxide film. Accordingly, the titanium film does not generate heat when the titanium oxide film is being reduced. In addition, since the titanium film and the titanium oxide film are formed after the nickel film is formed, no nickel oxide film is formed on the surface of the nickel film.

For example, as Comparative Example 1, assume that a titanium film, a titanium oxide film and a nickel film are formed sequentially. In this case, after the titanium film and the titanium oxide film are formed, the titanium film is selectively removed, for example, by dry etching high in controllability, to thereby expose a silicon carbide semiconductor portion in a contact hole. Then, when a resist mask which was used for the drying etching is removed, the surface of the silicon carbide semiconductor portion exposed in the contact hole is oxidized. Therefore, before the nickel film is formed, a cleaning step using hydrogen fluoride is performed to remove the oxide film formed in the surface of the silicon carbide semiconductor portion. However, there is a fear that the thickness of the titanium oxide film may be reduced due to the cleaning step, or the titanium oxide film may be removed to thereby expose the titanium film in the worse situation. In the case where the thickness of the titanium oxide film has been reduced, there is a fear that the period of time from the time instant when the nickel film starts to generate heat to the time instant when the reduction of the titanium oxide film is completed may be shortened so that the temperature of the nickel film cannot be increased sufficiently to the temperature at which the nickel film can form an ohmic contact with the silicon carbide semiconductor portion. In the case where hydrogen plasma treatment has been performed in the state in which the titanium film is exposed, the titanium film is heated before the nickel film is heated. Therefore, an extra thermal history is applied to a portion covered with the titanium film. As a result, the device characteristic deteriorates.

In addition, for example, as Comparative Example 2, assume that a titanium film, a nickel film and a titanium oxide film are formed sequentially. In this case, when the surface of the titanium film is oxidized to form a titanium oxide film, the surface of the nickel film is also oxidized to form a nickel oxide film. The nickel oxide film in the surface of the nickel film can be removed because the nickel oxide film is reduced in the same manner as the titanium oxide film during hydrogen plasma treatment. However, the nickel film cannot generate heat unless the nickel oxide film is reduced. Therefore, there is a fear that the period of time from the time instant when the nickel film starts to generate heat to the time instant when reduction of the titanium oxide film is completed may be shortened so that the temperature of the nickel film cannot be increased sufficiently to the temperature at which the nickel film can form an ohmic contact with the silicon carbide semiconductor portion. In addition, the nickel film is formed after the titanium film is formed. Accordingly, in the same manner as in Comparative Example 1, the surface of the silicon carbide semiconductor portion exposed in the contact hole is oxidized when the titanium film is selectively removed. In the case where the nickel film is formed without any cleaning step using hydrogen fluoride, an oxide film stays behind between the silicon carbide semiconductor portion and the nickel film so that the nickel film cannot be silicified. As a result, the nickel film cannot form an ohmic contact with the silicon carbide semiconductor portion.

On the other hand, in the embodiment, as described above, the silicon carbide semiconductor portion and the nickel film can be brought into direct contact with each other so that the nickel film can be silicified. No nickel oxide film is formed in the surface of the nickel film, and hydrogen plasma treatment can be performed in the state in which the titanium oxide film has been formed in the surface of the titanium film. Therefore, the aforementioned problems arising in Comparative Examples 1 and 2 do not arise. That is, according to the embodiment, the nickel film can be silicified so that the nickel film can form an ohmic contact with the silicon carbide semiconductor portion. In addition, hydrogen plasma treatment can be performed in the state in which the titanium film has been covered with the titanium oxide film. Accordingly, the titanium film does not generate heat when the titanium oxide film is being reduced. In this manner, no extra thermal history is applied to the portion covered with the titanium film, i.e. to the MOS gate located on the lower side (silicon carbide substrate side) of the titanium film so that the device characteristic can be prevented from deteriorating. In addition, hydrogen plasma treatment can be performed in the state in which the nickel film has been exposed. Accordingly, the nickel film can generate heat at the same time as the hydrogen plasma treatment starts. In this manner, the temperature of the nickel film can be increased to a high temperature in a short time so that an excellent ohmic contact low in contact resistance can be formed.

In addition, according to the embodiment, the titanium film is formed after the nickel film is formed. Accordingly, the titanium film is formed while the resist mask for selectively removing the nickel film is left as it is. Then, by a simple method of removing the resist mask, the titanium film can be left easily and entirely in the other portion (the flat portion of the interlayer dielectric) than the portion where the nickel film has been formed. In this manner, the surface of the interlayer dielectric can be covered entirely and completely with the nickel film and the titanium film. When the titanium oxide film is then formed in the surface of the titanium film, hydrogen plasma treatment can be performed in the state in which the nickel film and the titanium oxide film have been exposed. It has been confirmed by the present inventor that the gate insulating film deteriorates when hydrogen plasma has penetrated the gate insulating film. However, in the invention, the nickel film and the titanium film covering the whole surface of the interlayer dielectric serve as barrier metals for blocking hydrogen radicals. Therefore, the hydrogen radicals can be prevented from penetrating the interlayer dielectric and invading the side of the MOS gate. The gate insulating film can be prevented from deteriorating due to the hydrogen radicals. Thus, the device characteristic can be prevented from deteriorating.

In addition, according to the embodiment, the temperature of the nickel film is increased to a high temperature in a short time. Accordingly, the nickel film can be silicified before carbon (C) is precipitated on the surface of the nickel film or before the precipitation amount of carbon increases. Further, carbon precipitated in the inside or on the surface of the silicified portion of the nickel film reacts with hydrogen radicals to be formed into hydrocarbon such as methane ($CH_4$) gas, which is then discharged to the outside. Therefore, the precipitation amount of carbon on the surface of the nickel film can be reduced.

The invention which has been described above is not limited to the aforementioned embodiment but may be changed variously without departing from the spirit and scope of the invention. In addition, although the aforementioned embodiment has been described in the case where a silicon carbide substrate is used by way of example, a semiconductor substrate (silicon substrate) using silicon can also obtain the same effect. Incidentally, in the case where the silicon substrate is used, the heating temperature of a transition metal film caused by binding energy released when hydrogen radicals are adsorbed to be formed into hydrogen molecules is set based on the state of the silicon substrate, the melting point of the transition metal film, etc. In addition, although the MOSFET has been described by way of example in the aforementioned embodiment, the aforementioned embodiment can be applied to any other MOS type semiconductor device such as an IGBT (Insulated Gate Bipolar Transistor), or a semiconductor device having a device structure in which the device characteristic may change when an insulating film, a semiconductor portion, etc. is heated.

As described above, the method for manufacturing the semiconductor device according to the invention is useful for a power semiconductor device particularly used in a semiconductor device using a silicon carbide semiconductor.

What is claimed is:

1. A method for manufacturing a semiconductor device, comprising, in the order recited:
   (a) forming a device structure on a surface of a semiconductor substrate;
   (b) forming an interlayer dielectric on the surface of the semiconductor substrate so as to cover the device structure;
   (c) forming a contact hole that penetrates the interlayer dielectric in a depth direction;
   (d) forming a transition metal film on a portion of the semiconductor substrate exposed by the contact hole;
   (e) forming a metal film on a whole of the surface of the semiconductor substrate on a side where the transition metal film has been formed, the metal film being effective to prevent hydrogen radicals and hydrogen atoms from penetrating downward and invading the device structure;
   (f) forming an oxide film in a surface of the metal film, the oxide film being effective to firmly bound to the metal film and being more chemically stable than the metal film;
   (g) selectively removing the metal film in which the oxide film has been formed, to thereby expose the transition metal film; and
   (h) exposing, to a hydrogen plasma atmosphere, the semiconductor substrate in which the transition metal film and the oxide film have been exposed, to thereby cause the transition metal film to generate heat so that the transition metal film and the semiconductor substrate can react with each other due to thermal conduction from the transition metal film and thereby form an ohmic contact there between.

2. The method for manufacturing a semiconductor device according to claim 1, wherein, during selectively removing the metal film, the metal film is left on a portion of the surface of the semiconductor substrate other than the portion where the transition metal film has been formed.

3. The method for manufacturing a semiconductor device, according to claim 2, wherein forming a transition metal film includes:
   forming the transition metal film on a whole surface of the semiconductor substrate on a side where the interlayer dielectric has been formed,
   forming a resist mask covering a portion of the transition metal film which has been formed inside the contact hole, and
   performing etching using the resist mask as a mask to selectively remove the transition metal film to thereby expose the interlayer dielectric;
   wherein, during forming a metal film, the metal film is formed on a surface of the interlayer dielectric and on a surface of the resist mask; and
   wherein, during selectively removing the metal film, the resist mask is removed to thereby selectively remove the metal film.

4. The method for manufacturing a semiconductor device, according to claim 2, wherein, during exposing, to a hydrogen plasma atmosphere, the semiconductor substrate, the oxide film is reduced and the transition metal film is made to generate heat, so that the exposing can be completed before or at the same time as the reduction of the oxide film is completed.

5. The method for manufacturing a semiconductor device, according to claim 2, wherein the metal film is a titanium film.

6. The method for manufacturing a semiconductor device, according to claim 2, wherein the transition metal film is
   a metal layer made of nickel or tungsten, or
   an alloy layer containing at least one of nickel, titanium, tungsten, molybdenum, tantalum and silver as its main component.

7. The method for manufacturing a semiconductor device, according to claim 2, wherein, during exposing, to a hydrogen plasma atmosphere, the semiconductor substrate, the transition metal film reacts with the semiconductor substrate made of silicon carbide so that the transition metal film can be silicified to thereby form the ohmic contact there between.

8. The method for manufacturing a semiconductor device, according to claim 2, wherein the device structure is an insulated gate structure made of a metal, an oxide film and a semiconductor.

9. The method for manufacturing a semiconductor device, according to claim 1, wherein forming a transition metal film includes:
   forming the transition metal film on a whole surface of the semiconductor substrate on a side where the interlayer dielectric has been formed,
   forming a resist mask covering a portion of the transition metal film which has been formed inside the contact hole, and
   performing etching using the resist mask as a mask to selectively remove the transition metal film to thereby expose the interlayer dielectric;
   wherein, during forming a metal film, the metal film is formed on a surface of the interlayer dielectric and on a surface of the resist mask; and
   wherein, during selectively removing the metal film, the resist mask is removed to thereby selectively remove the metal film.

10. The method for manufacturing a semiconductor device, according to claim 9, wherein, during exposing, to a hydrogen plasma atmosphere, the semiconductor substrate, the oxide film is reduced and the transition metal film is made to generate heat, so that the exposing can be completed before or at the same time as the reduction of the oxide film is completed.

11. The method for manufacturing a semiconductor device, according to claim 1, wherein, during exposing, to a hydrogen plasma atmosphere, the semiconductor substrate, the oxide film is reduced and the transition metal film is made to generate heat, so that the exposing can be completed before or at the same time as the reduction of the oxide film is completed.

12. The method for manufacturing a semiconductor device, according claim 11, wherein the metal film is a titanium film.

13. The method for manufacturing a semiconductor device, according to claim 11, wherein the transition metal film is
   a metal layer made of nickel or tungsten, or
   an alloy layer containing at least one of nickel, titanium, tungsten, molybdenum, tantalum and silver as its main component.

14. The method for manufacturing a semiconductor device, according to claim 11, wherein, during exposing, to a hydrogen plasma atmosphere, the semiconductor substrate, the transition metal film reacts with the semiconductor substrate made of silicon carbide so that the transition metal film can be silicified to thereby form the ohmic contact there between.

15. The method for manufacturing a semiconductor device, according to claim 11, wherein the device structure is an insulated gate structure made of a metal, an oxide film and a semiconductor.

16. The method for manufacturing a semiconductor device, according to claim 1, wherein the metal film is a titanium film.

17. The method for manufacturing a semiconductor device, according to claim 1, wherein the transition metal film is
   a metal layer made of nickel or tungsten, or
   an alloy layer containing at least one of nickel, titanium, tungsten, molybdenum, tantalum and silver as its main component.

18. The method for manufacturing a semiconductor device, according to claim 1, wherein, during exposing, to a hydrogen plasma atmosphere, the semiconductor substrate, the transition metal film reacts with the semiconductor substrate made of silicon carbide so that the transition metal film can be silicified to thereby form the ohmic contact there between.

19. The method for manufacturing a semiconductor device, according to claim 1, wherein the device structure is an insulated gate structure made of a metal, an oxide film and a semiconductor.

20. A method for manufacturing a semiconductor device including a metal-oxide-semiconductor (MOS) gate structure, the method comprising, in the order recited:
   (a) forming a device structure on a surface of a semiconductor substrate;
   (b) forming an interlayer dielectric on the surface of the semiconductor substrate so as to cover the device structure;
   (c) forming a contact hole that penetrates the interlayer dielectric in a depth direction;
   (d) forming a transition metal film on a portion of the semiconductor substrate exposed by the contact hole;
   (e) forming a metal film on a whole of the surface of the semiconductor substrate on a side where the transition metal film has been formed;
   (f) forming an oxide film in a surface of the metal film;
   (g) selectively removing the metal film in which the oxide film has been formed, to thereby expose the transition metal film; and
   (h) exposing, to a hydrogen plasma atmosphere, the semiconductor substrate in which the transition metal film and the oxide film have been exposed, to thereby cause the transition metal film to generate heat so that the transition metal film and the semiconductor substrate can react with each other due to thermal conduction from the transition metal film and thereby form an ohmic contact there between.

* * * * *